(12) United States Patent
Chai et al.

(10) Patent No.: US 10,739,833 B2
(45) Date of Patent: Aug. 11, 2020

(54) FLUID CONNECTOR ASSEMBLY

(71) Applicant: Cooler Master Co., Ltd., New Taipei (TW)

(72) Inventors: Chun-Yu Chai, New Taipei (TW);
Wen-Hong Chen, New Taipei (TW);
Chien-Liang Lin, New Taipei (TW);
Chia-Hao Sung, New Taipei (TW);
Hsin-Hung Chen, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 119 days.

(21) Appl. No.: 16/140,604

(22) Filed: Sep. 25, 2018

(65) Prior Publication Data

US 2019/0369681 A1    Dec. 5, 2019

(30) Foreign Application Priority Data

Jun. 4, 2018    (TW) .............................. 107119198 A

(51) Int. Cl.
| | |
|---|---|
| *G06F 1/20* | (2006.01) |
| *H01R 13/717* | (2006.01) |
| *H01R 13/633* | (2006.01) |
| *H01R 13/631* | (2006.01) |
| *H05K 7/20* | (2006.01) |

(52) U.S. Cl.
CPC ......... *G06F 1/203* (2013.01); *H01R 13/6315* (2013.01); *H01R 13/6335* (2013.01); *H01R 13/717* (2013.01); *H05K 7/20272* (2013.01); *G06F 2200/201* (2013.01)

(58) Field of Classification Search
CPC .............. H05K 7/20272; H01R 13/717; H01R 13/6215; H01R 13/193; G06F 1/203

USPC ......................................... 439/485, 364, 372
See application file for complete search history.

(56) References Cited

U.S. PATENT DOCUMENTS

| | | | | | |
|---|---|---|---|---|---|
| 3,796,985 | A | * | 3/1974 | Weber ................ | H01R 13/6215 439/359 |
| 3,853,381 | A | * | 12/1974 | Morningstar ...... | H01R 13/6215 439/364 |
| 4,026,623 | A | * | 5/1977 | Goodman ............ | H01R 13/193 439/261 |

(Continued)

*Primary Examiner* — Abdullah A Riyami
*Assistant Examiner* — Marcus E Harcum
(74) *Attorney, Agent, or Firm* — Locke Lord LLP; Tim Tingkang Xia, Esq.

(57) ABSTRACT

The disclosure provides a connector assembly which includes a first connector module, a second connector module and a connection assistance module. The first connector module includes a first carrier and two first connectors which are fixed to the first carrier. The second connector module includes a second carrier and two second connectors which are fixed to the second carrier. The second connectors are respectively and detachably connected to the first connectors. The connection assistance module includes a rotatable component and an assembled component respectively disposed on the first carrier and the second carrier. The rotatable component has an inclined surface, and the assembled component has an engaging portion. When the rotatable component is rotated, the engaging portion is guided by the inclined surface so that the first carrier is moved toward or away from the second carrier, allowing the first connectors to be detachably connected to the second connectors.

44 Claims, 14 Drawing Sheets

(56) References Cited

U.S. PATENT DOCUMENTS

| | | | | |
|---|---|---|---|---|
| 4,483,575 A * | 11/1984 | Kruger | H01R 13/4534 | 439/102 |
| 5,007,858 A * | 4/1991 | Daly | H01R 23/661 | 439/498 |
| 5,213,532 A * | 5/1993 | Mee | B64G 1/64 | 439/359 |
| 5,266,047 A * | 11/1993 | Black | H01R 13/631 | 439/364 |
| 5,376,016 A * | 12/1994 | Inaba | H01R 13/6215 | 439/357 |
| 5,486,119 A * | 1/1996 | Nabeshima | H01R 13/6215 | 439/364 |
| 5,720,624 A * | 2/1998 | Ikeda | H01R 13/6215 | 439/364 |
| 5,743,756 A * | 4/1998 | Hasz | H01R 13/4367 | 439/364 |
| 6,099,342 A * | 8/2000 | Letourneau | H01R 13/629 | 439/372 |
| 6,544,065 B1 * | 4/2003 | Howell | H01R 12/88 | 439/342 |
| 6,726,498 B2 * | 4/2004 | Pogliani | H01R 13/5202 | 439/272 |
| 6,799,605 B1 * | 10/2004 | Van Scyoc | F16L 37/56 | 137/594 |
| 6,896,535 B2 * | 5/2005 | Yamada | H01R 12/714 | 439/289 |
| 7,270,562 B1 * | 9/2007 | Trout | H01R 13/6215 | 439/364 |
| 7,980,881 B2 * | 7/2011 | Furio | H01R 12/515 | 439/364 |
| 8,545,153 B2 * | 10/2013 | Smith | F16B 31/02 | 411/107 |
| 8,820,351 B1 * | 9/2014 | Harrington | H05K 7/20281 | 137/595 |
| 9,829,132 B2 * | 11/2017 | Chen | G06F 1/20 | |
| 9,966,748 B1 * | 5/2018 | Eom | H01R 4/34 | |
| 10,594,072 B2 * | 3/2020 | Lim | H01R 13/521 | |
| 2003/0194906 A1 * | 10/2003 | Arkin | H01R 13/717 | 439/490 |
| 2013/0291368 A1 * | 11/2013 | Davidson | H05K 7/20809 | 29/592.1 |

* cited by examiner

FLUID CONNECTOR ASSEMBLY

CROSS-REFERENCE TO RELATED APPLICATIONS

This non-provisional application claims priority under 35 U.S.C. § 119(a) on Patent Application No(s). 107119198 filed in Taiwan, R.O.C. on Jun. 4, 2018, the entire contents of which are hereby incorporated by reference.

TECHNICAL FIELD

The disclosure relates to a connector assembly, more particularly to a connector assembly having a connection assistance module.

BACKGROUND

Notebook computer is portable and small in size, thus more and more users prefer to use the notebook computer instead of desktop computer. Due to the compactness and small size of the notebook computer, electronic components (e.g., a fan, CPU and GPU) in the notebook computer are tightly arranged so that they are only spaced by a small distance. With the increase amount of heat generated by the electronic component, the heat dissipation device, such as a fan, is difficult to provide enough heat dissipation effect in such configuration, resulting the performance of the notebook computer is limited.

In order to solve the aforementioned problem, manufactures develop an external liquid cooling device to improve the heat dissipation effect of the notebook computer.

Although the external liquid cooling device can help the notebook computer to achieve better performance, the portability of notebook computer still has to be satisfied, thus the external liquid cooling device is designed to be detachable from the notebook computer, allowing the user to detach the external liquid cooling device from the notebook computer. However, it is troublesome and time-consuming in connecting and detaching the external liquid cooling device and the notebook.

SUMMARY OF THE INVENTION

The disclosure provides a connector assembly which is capable of solving the prior art problems that it is troublesome and time-consuming in connecting and detaching the external liquid cooling device and the notebook.

One embodiment of the disclosure provides a connector assembly. The connector assembly includes a first connector module, a second connector module and a connection assistance module. The first connector module includes a first carrier and at least two first connectors. The two first connectors are fixed to the first carrier. The second connector module includes a second carrier and at least two second connectors. The two second connectors are fixed to the second carrier, and the two second connectors are respectively and detachably connected to the two first connectors. The connection assistance module includes a rotatable component and an assembled component. The rotatable component is rotatably disposed on the first carrier and has an inclined surface. A normal line of the inclined surface and a rotation axis of the rotatable component form an acute angle. The assembled component is mounted on the second carrier and has an engaging portion. When the rotatable component is rotated, the engaging portion of assembled component is guided by the inclined surface so that the first carrier is moved toward or away from the second carrier, allowing the two first connectors to be detachably connected to the two second connectors.

Another embodiment of the disclosure provides a connector assembly. The connector assembly includes a first connector module, a second connector module, a connection assistance module and a driver. The first connector module includes a first carrier and at least two first connectors, and the two first connectors are fixed to the first carrier. The second connector module includes a second carrier and at least two second connectors. The two second connectors are fixed to the second carrier and respectively and detachably connected to the at least two first connectors. The connection assistance module is connected to the first carrier and the second carrier, and the connection assistance module is configured to move the first carrier toward or away from the second carrier. The driver is connected to the connection assistance module and configured to drive the connection assistance module to move the first carrier toward or away from the second carrier.

According to the connector assembly as discussed above, with the help of the rotatable component of the connection assistance module, assembling the first connectors of the first connector module and the second connectors of the second connector module is time-saving and convenient.

In addition, it also can prevent the connectors from being broken due to hit between the connectors during the assembling process.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
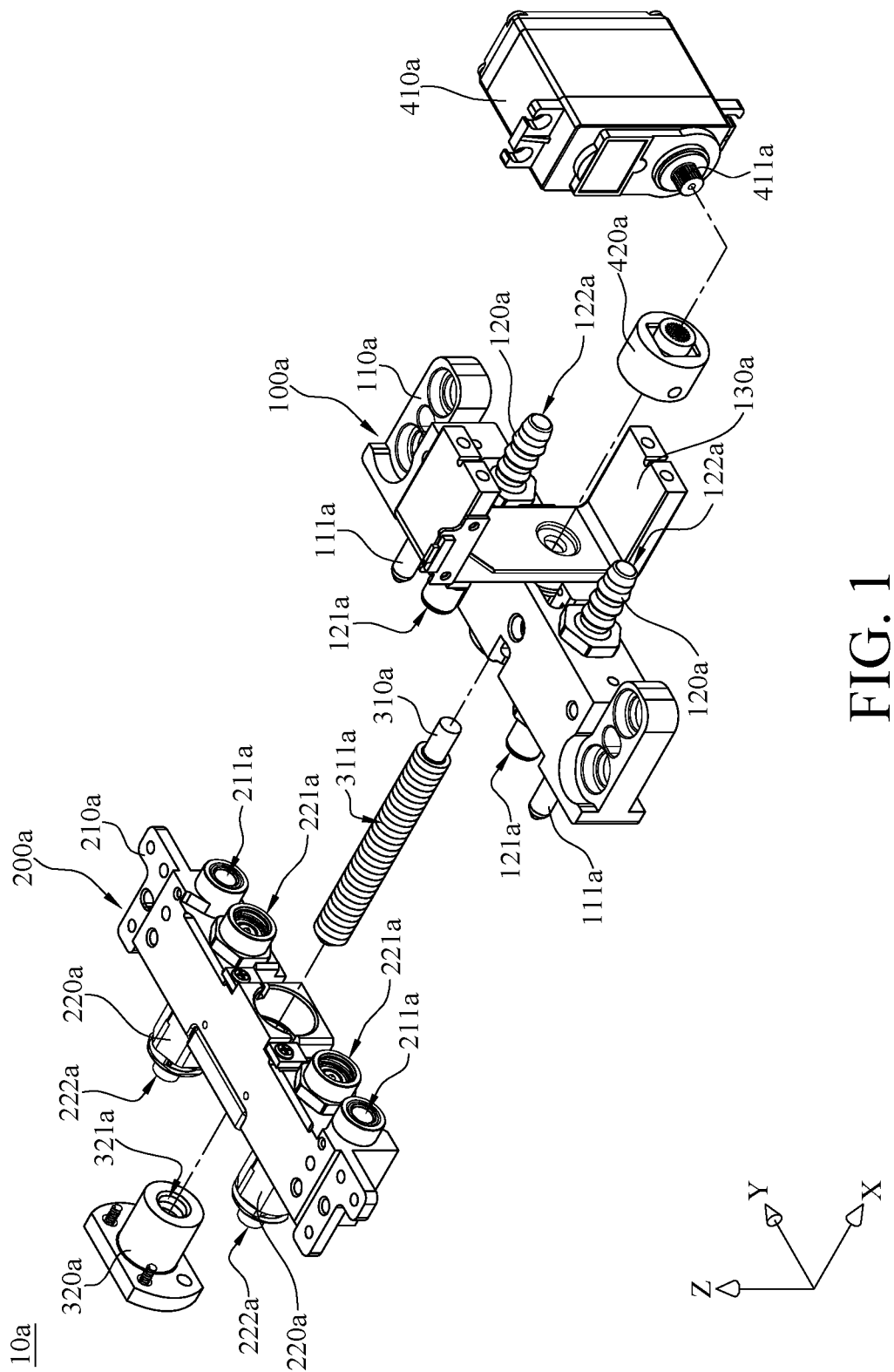
FIG. 1 is an exploded view of a connector assembly according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
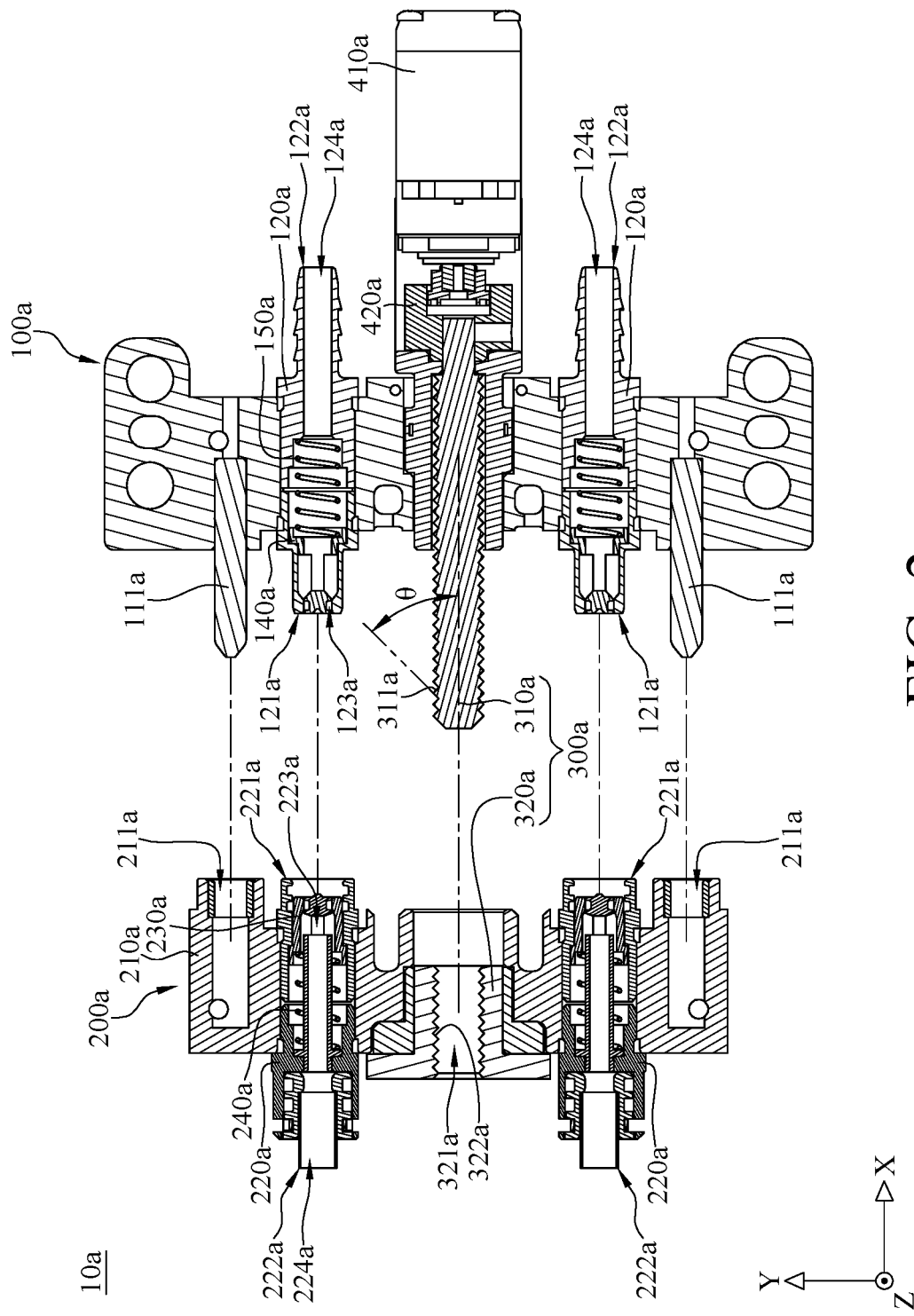
FIG. 2 is a cross-sectional view of the connector assembly according to the first embodiment of the disclosure.
Figure 3:
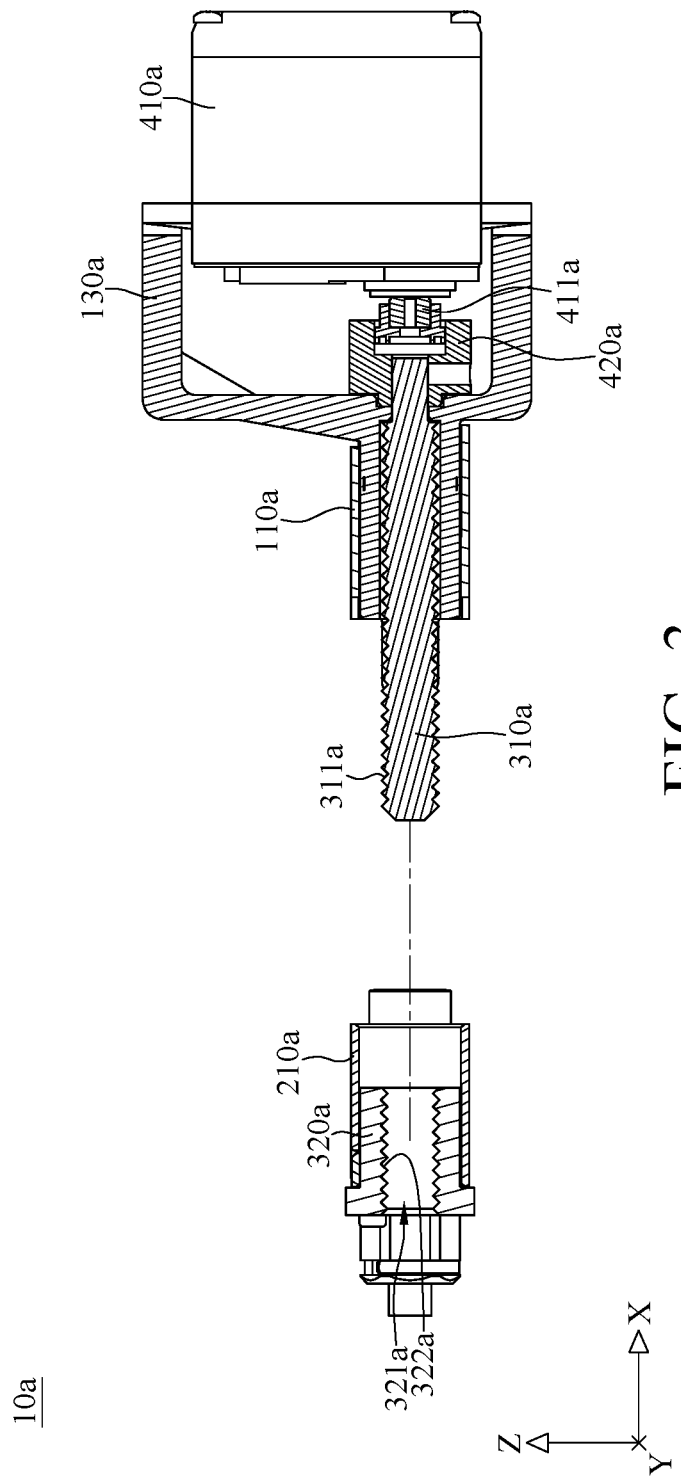
FIG. 3 is another cross-sectional view of the connector assembly according to the first embodiment of the disclosure.

Please refer to FIG. 1 to FIG. 3. FIG. 1 is an exploded view of a connector assembly according to a first embodiment of the disclosure. FIG. 2 is a cross-sectional view of the connector assembly according to the first embodiment of the disclosure. FIG. 3 is another cross-sectional view of the connector assembly according to the first embodiment of the disclosure.

This embodiment provides a connector assembly 10a. The connector assembly 10a includes a first connector module 100a, a second connector module 200a and a connection assistance module 300a.

The first connector module 100a includes a first carrier 110a, two first connectors 120a and a fixing frame 130a. The first carrier 110a is, for example, mounted on a casing of an external liquid cooling device (not shown in figures). The first carrier 110a has two guiding pillars 111a. The two first connectors 120a are disposed through and fixed to the first carrier 110a. The two first connectors 120a is configured to deliver fluid, and each of the first connectors 120a has a coupling end 121a and a connecting end 122a. Each of the first connectors 120a has a first coupling opening 123a at the coupling end 121a and a first connecting opening 124a at the connecting end 122a, and the first coupling opening 123a is connected to the first connecting opening 124a. The two first connecting openings 124a of the two first connectors 120a are configured to be connected to the external liquid cooling device so as to allow coolant of the external liquid cooling device to flow to the first coupling openings 123a from the first connecting opening 124a, or allow coolant which absorbs heat from the first coupling openings 123a to flow to the external liquid cooling device via the first connecting openings 124a. The fixing frame 130a is mounted on the first carrier 110a and located between the two connecting ends 122a of the two first connectors 120a.

The second connector module 200a includes a second carrier 210a and two second connectors 220a. The second carrier 210a is, for example, mounted on a portable electronic device such as a notebook computer or an all-in-one computer. The second carrier 210a has two guiding through holes 211a. The two guiding pillars 111a respectively correspond to the two guiding through holes 211a so as to guide the first carrier 110a to move close to or away from the second carrier 210a in a straight line. The two second connectors 220a are disposed through and fixed to the second carriers 210a. The two second connectors 220a are respectively and detachably connected to the two first connectors 120a.

In detail, the two second connectors 220a are configured to deliver fluid, and each of the second connectors 220a has a coupling end 221a and a connecting end 222a. Each of the second connectors 220a has a second coupling opening 223a at the coupling end 221a and a second connecting opening 224a at the connecting end 222a. The two second coupling openings 223a are respectively and detachably connected to the two first coupling openings 123a of the two first connectors 120a. The two second connecting openings 224a are respectively connected to the two second coupling openings 223a. The two second connecting openings 224a are configured to be connected to an internal liquid cooling device of a notebook computer so as to allow coolant of the internal liquid cooling device to flow to the first connecting openings 124a via the second connecting openings 224a, or allow cooled coolant from the first connecting openings 124a to flow to the internal liquid cooling device via the second connecting openings 224a.

In this embodiment, the first connectors 120a are disposed through the first carrier 110a, and the second connectors 220a are disposed through the second carrier 210a, but the present disclosure is not limited thereto. In some other embodiments, the first connectors and the second connectors may be respectively fixed to the first carrier and second carrier via the fixing frames.

In addition, the quantities of the first connectors 120a and the second connectors 220a are not respectively restricted in two. In some other embodiments, the connector assembly may include three or more than three first connectors and second connectors.

Moreover, the two first connectors 120a are located between the two guiding pillars 111a, and the two second connectors 220a are located between the two guiding through holes 211a, but the present disclosure is not limiter thereto. In some other embodiments, the two guiding pillars may be located between the two first connectors, and the two guiding through holes may be located between the two second connectors.

The connection assistance module 300a includes a rotatable component 310a and an assembled component 320a. The rotatable component 310a is, for example, a screw rod. The rotatable component 310a is rotatably disposed on the first carrier 110a, and the rotatable component 310a has an inclined surface 311a. A normal line of the inclined surface 311a and a rotation axis of the rotatable component 310a form an acute angle θ. In detail, the inclined surface 311a is a surface of threads of the rotatable component 310a which faces the first carrier 110a, and the inclined surface 311a extends in a spiral manner. The assembled component 320a is in a ring shape and mounted on the second carrier 210a. The assembled component 320a has a through hole 321a and an engaging portion 322a. The engaging portion 322a protrudes from an inner surface of the assembled component 320a which surrounds the through hole 321a and extends in a spiral manner; that is, the engaging portion 322a is an inner thread of the assembled component 320a. A part of the inclined surface 311a is engaged with the engaging portion 322a so that the rotatable component 310a is mounted in the through hole 321a of the assembled component 320a.

In this embodiment, the rotatable component 310a is disposed through the first carrier 110a, and the rotatable component 310a is located between the two first connectors 120a. The two second connectors 220a are disposed through the second carrier 210a, and the assembled component 320a is located between the two second connectors 220a. However, the positions of the rotatable component 310a and the assembled component 320a are not restricted in the disclosure. In some other embodiments, the rotatable component may be located on the same side of the two first connectors, and the assembled component may be located on the same side of the two second connectors.

In this embodiment, the connector assembly 10a further includes a driver 410a and a shaft coupler 420a. The driver 410a is, for example, a motor. The driver 410a is mounted on the fixing frame 130a and has an output shaft 411a. The shaft coupler 420a is coupled to the output shaft 411a and the rotatable component 310a so that the driver 410a is able to rotate the rotatable component 310a.

The driver 410a may not be a motor. In some other embodiments, the driver may be a pressure type driver.

Figure 4:
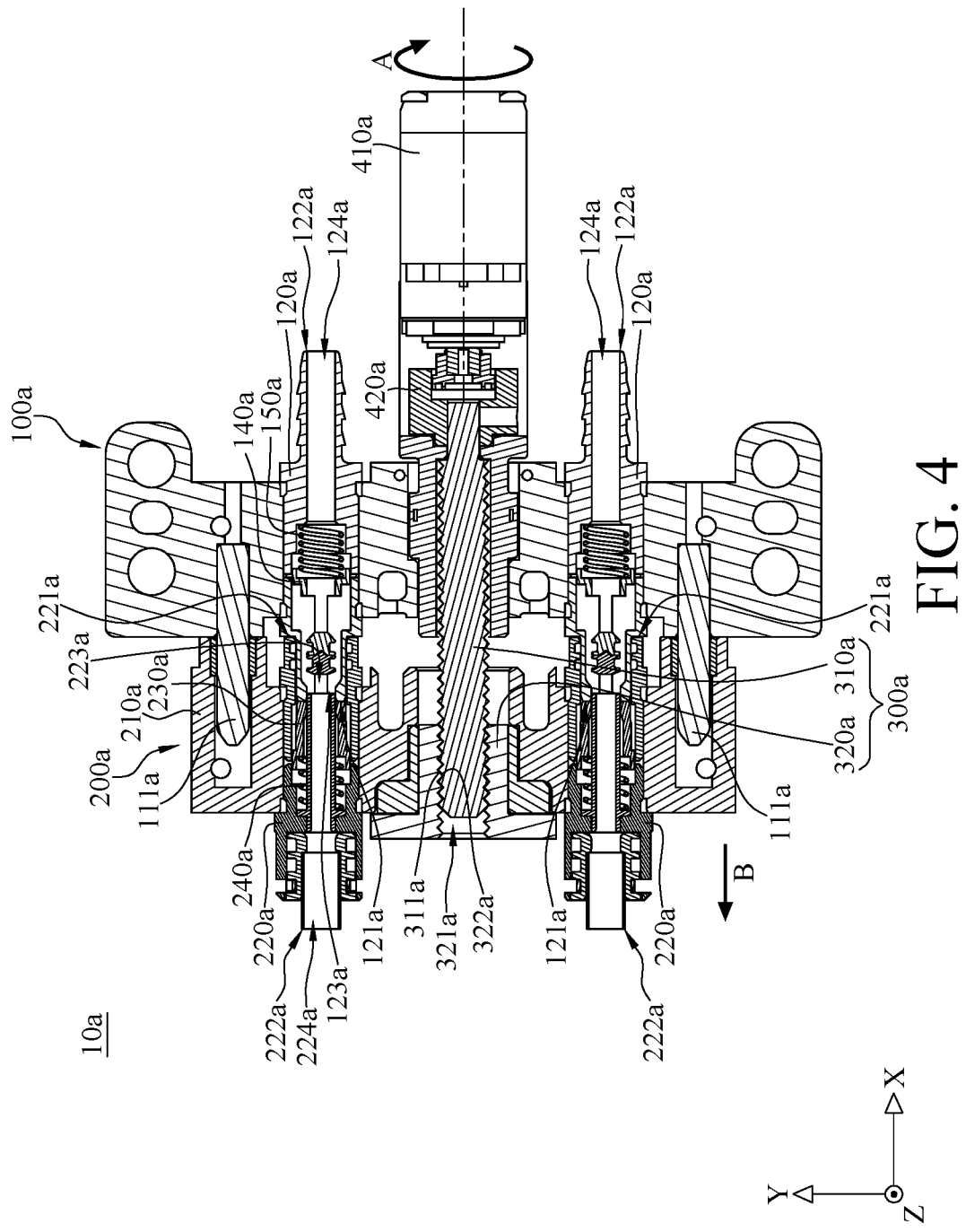
FIG. 4 is a cross-sectional view of the connector assembly according to the first embodiment of the disclosure while in an assembled state.
Figure 5:
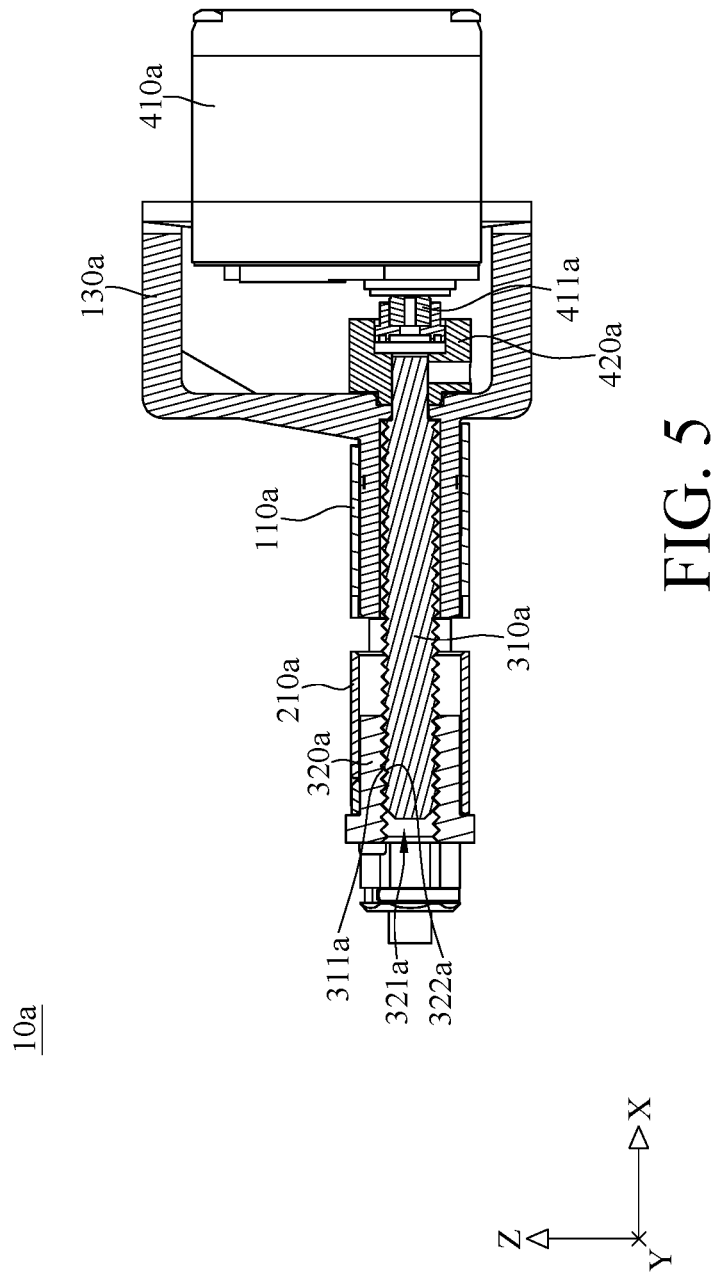
FIG. 5 is another cross-sectional view of the connector assembly in FIG. 4.

Please refer to FIG. 2 to FIG. 5. FIG. 4 is a cross-sectional view of the connector assembly according to the first embodiment of the disclosure while in an assembled state. FIG. 5 is another cross-sectional view of the connector assembly in FIG. 4.

As shown in FIG. 4 and FIG. 5, when the driver 410a is activated to rotate the rotatable component 310a in a direction A, the engaging portion 322a of the assembled component 320a is guided by the inclined surface 311a of the rotatable component 310a so that the first carrier 110a is moved toward the second carrier 210a in a direction B, and the two second coupling openings 223a of the two second connectors 220a are respectively connected to the two first coupling openings 123a of the two first connectors 120a with the guidance of the guiding pillars 111a and the guiding through holes 211a.

On the contrary, by activating the driver 410a to rotate the rotatable component 310a in a direction opposite to the direction A, the engaging portion 322a of the assembled component 320a is not restricted by the inclined surface 311a of the rotatable component 310a, allowing the first carrier 110a to be moved away from the second carrier 210a. By doing so, the two first connectors 120a are respectively able to be detached from the two second connectors 220a with the guidance of the guiding pillars 111a and the guiding through holes 211a.

Moreover, in this embodiment, the first connector module 100a further includes at least two first valves 140a and at least two first elastic components 150a. The two first valves 140a are respectively and movably located in the two first connectors 120a. The two first elastic components 150a are, for example, compression springs. Two opposite ends of each of the two first elastic components 150a respectively press against one of the first valves 140a and one of the first connectors 120a so that the two first valves 140a are respectively moved toward the first coupling openings 123a of the two first connectors 120a and thus seal the first coupling openings 123a.

The second connector module 200a further includes at least two second valves 230a and the at least two second elastic components 240a. The two second valves 230a are respectively and movably located in the two second connectors 220a. The two second elastic components 240a are, for example, compression springs. Two opposite ends of each of the two second elastic components 240a respectively press against one of the second valves 230a and one of the second connectors 220a so that the two second valves 230a are respectively moved toward the second coupling openings 223a of the two second connectors 220a and thus seal the second coupling openings 223a.

As such, when the two second coupling openings 223a are respectively connected to the two first coupling openings 123a, the coupling ends 121a of the first connectors 120a respectively press the second valves 230a, and the coupling ends 221a of the second connectors 220a respectively press the first valves 140a, such that the first connectors 120a are respectively connected to the second connectors 220a. Therefore, when the two second coupling opening 223a are respectively detached from the two first coupling openings 123a, the second valves 230a are not respectively pressed by the coupling ends 121a, and the first valves 140a are not respectively pressed by the coupling ends 221a, such that the second valves 230a respectively seal the second coupling openings 223a by being pushed by the second elastic components 240a, and the first valves 140a respectively seal the first coupling openings 123a by being pushed by the first elastic components 150a.

Figure 6:
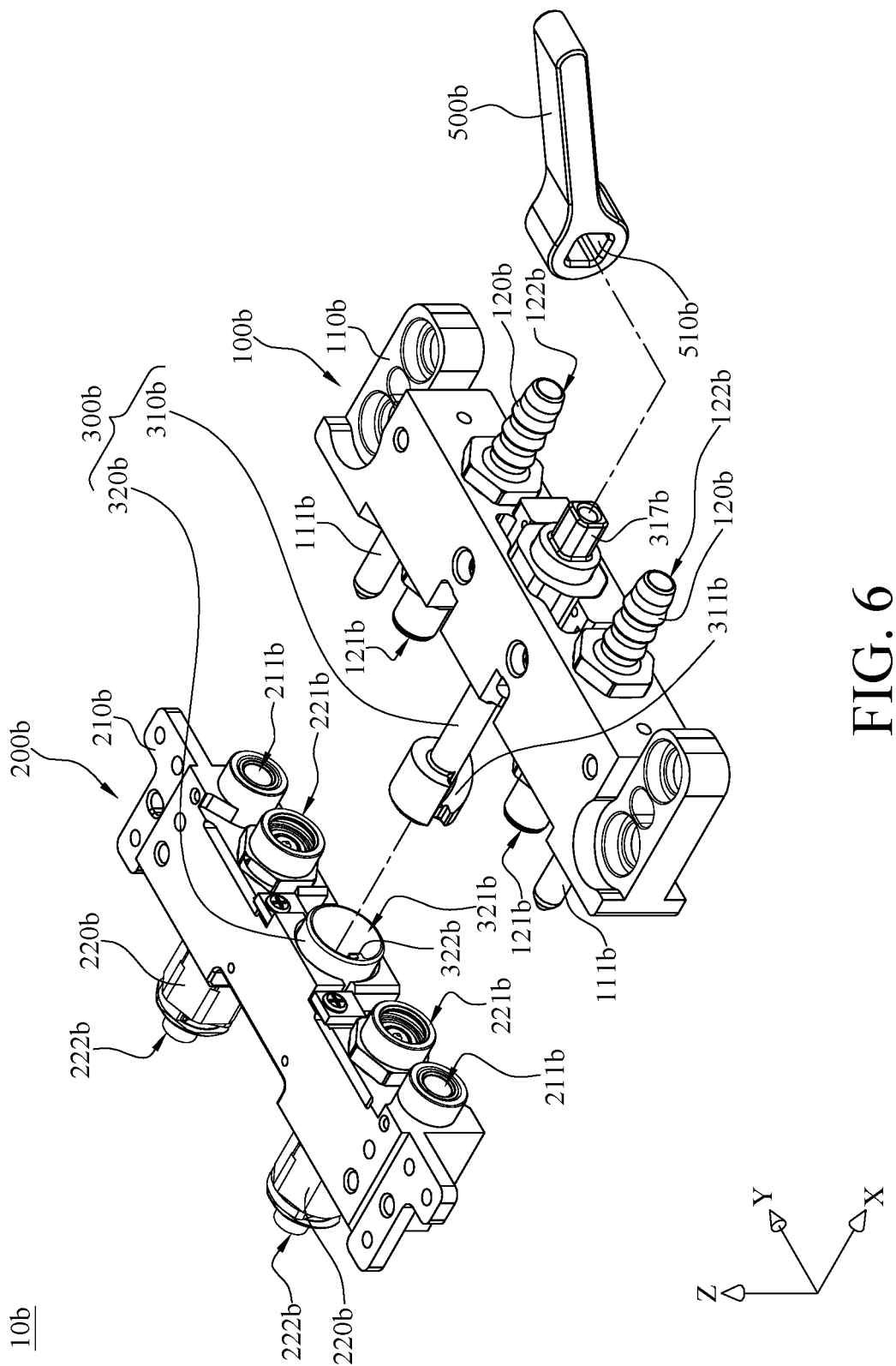
FIG. 6 is an exploded view of a connector assembly according to a second embodiment of the disclosure.
Figure 7:
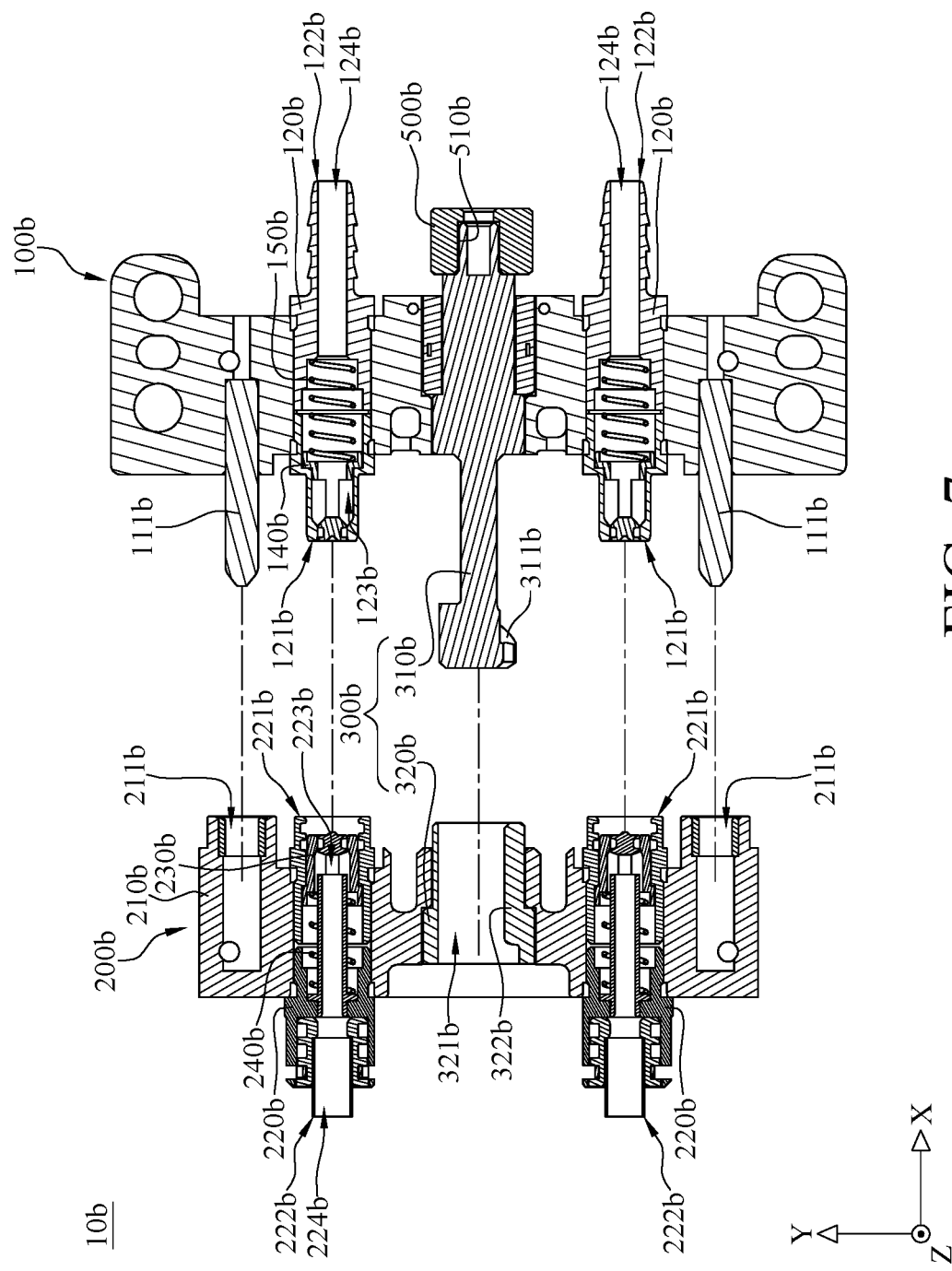
FIG. 7 is a cross-sectional view of the connector assembly according to the second embodiment of the disclosure.
Figure 8:
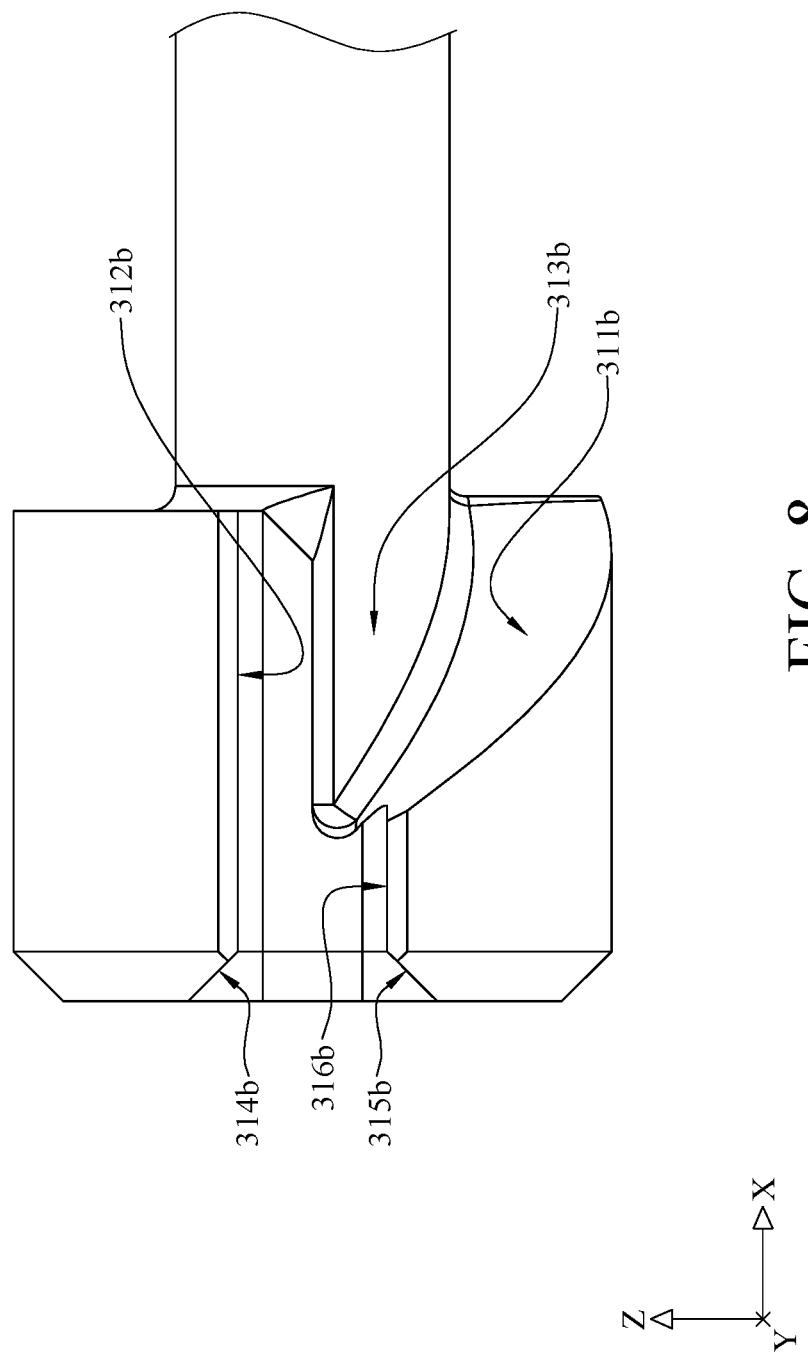
FIG. 8 is a partial enlarged view of a rotatable component of the connector assembly according to the second embodiment of the disclosure.

Please refer to FIG. 6 to FIG. 8. FIG. 6 is an exploded view of a connector assembly according to a second embodiment of the disclosure. FIG. 7 is a cross-sectional view of the connector assembly according to the second embodiment of the disclosure. FIG. 8 is a partial enlarged view of a rotatable component of the connector assembly according to the second embodiment of the disclosure.

This embodiment provides a connector assembly 10b. The connector assembly 10b includes a first connector module 100b, a second connector module 200b and a connection assistance module 300b.

The first connector module 100b includes a first carrier 110b, two first connectors 120b and a fixing frame 130b. The first carrier 110b is, for example, mounted on a casing of an external liquid cooling device (not shown). The first carrier 110b has two guiding pillars 111b. The two first connector 120b are disposed through and fixed to the first carrier 110b. The two first connectors 120b are configured to deliver fluid, and each of the two first connectors 120b has a coupling end 121b and a connecting end 122b. Each of the two first connectors 120b has a first coupling opening 123b at the coupling end 121b and a first connecting opening 124b at the connecting end 122b. The first connecting openings 124b are respectively connected to the first coupling openings 123b. The two first connecting opening 124b are configured to be connected to the external liquid cooling device so as to allow coolant of the external liquid cooling device to flow to the first coupling openings 123b from the first connecting openings 124b, or allow coolant which absorbs heat from the first coupling openings 123a to flow to the external liquid cooling device via the first connecting openings 124b. The fixing frame 130a is mounted on the first carrier 110a and located between the two connecting ends 122b of the two first connectors 120b.

The second connector module 200b includes a second carrier 210b and two second connectors 220b. The second carrier 210b is, for example, mounted on a portable electronic device such as a notebook computer or an all-in-one computer. The second carrier 210b has two guiding through holes 211b. The two guiding pillars 111b respectively correspond to the two guiding through holes 211a so as to guide the first carrier 110b to move close to or away from the second carrier 210a in a straight line. The two second connectors 220b are disposed through and fixed to the second carriers 210b. The two second connectors 220b are respectively and detachably connected to the two first connectors 120b.

In detail, the two second connectors 220b are configured to deliver fluid, and each of the second connectors 220b has a coupling end 221b and a connecting end 222b. Each of the second connectors 220a has a second coupling opening 223b at the coupling end 221b and a second connecting opening 224b at the connecting end 222b. The two second coupling openings 223b are respectively and detachably connected to the two first coupling openings 123b of the two first connectors 120b. The two second connecting openings 224b are respectively connected to the two second coupling openings 223b. The two second connecting openings 224b are configured to be connected to an internal liquid cooling device of a notebook computer so as to allow coolant of the internal liquid cooling device to flow to the first connecting openings 124b via the second connecting openings 224b, or allow cooled coolant from the first connecting openings 124b to flow to the internal liquid cooling device via the second connecting openings 224b.

The connection assistance module 300b includes a rotatable component 310b and an assembled component 320b. The rotatable component 310b has an inclined surface 311b, a lateral surface 312b, a first guiding surface 314b, a second guiding surface 315b and a connecting surface 316b. The lateral surface 312b faces the inclined surface 311b, and the lateral surface 312b and the inclined surface 311b form an acute angle. A groove 313b is formed between the lateral surface 312b and the inclined surface 311b. The first guiding surface 314b is connected to the lateral surface 312b, and the second guiding surface 315b is connected to the inclined surface 311b. A distance between the first guiding surface 314b and the second guiding surface 315b is increased from a side of the first guiding surface 314b close to the inclined surface 311b to a side of the first guiding surface 314b away from the inclined surface 311b. The second guiding surface 315b and the inclined surface 311b are respectively connected to two opposite sides of the connecting surface 316b, and the second guiding surface 315b is further away from the first carrier 110b than the inclined surface 311b. A normal line of the connecting surface 316b is perpendicular to a rotation axis of the rotatable component 310b, and the second guiding surface 315b faces away from the inclined surface 311b. The assembled component 320b has a through hole 321b and an engaging portion 322b. The engaging portion 322b protrudes from an inner surface of the assembled component 320b which surrounds the through holes 321b. A part of the inclined surface 311b is engaged with the engaging portion 322b. In this embodiment, the first guiding surface 314b and the second guiding surface 315b are configured to help the engaging portion 322b to enter into the groove 313b so as to allow the engaging portion 322b to be guided by the inclined surface 311b.

In this embodiment, the connector assembly 10b further includes a handle 500b. The handle 500b has an assembling slot 510b. The rotatable component 310b has an assembling head 317b which is located on an end of the rotatable component 310b away from the assembled component 320b. The assembling slot 510b of the handle 500b is mounted on the assembling head 317b of the rotatable component 310b. The handle 500b is configured to drive the rotatable component 310b to rotate with respect to the first carrier 110b. In this embodiment, the handle 500b can be detached from the rotatable component 310b, but the present disclosure is not limited thereto. In some other embodiments, the handle 500b and the rotatable component 310b may be made of a single piece. In addition, the handle 500b may be fixed to the rotatable component 310b via screws.

It is noted that, if the rotatable component 310b is replaced with the rotatable component 310a of the first embodiment, the handle 500b should be detachable from the rotatable component 310b in order to facilitate the operation of the rotatable component 310a.

Figure 9:
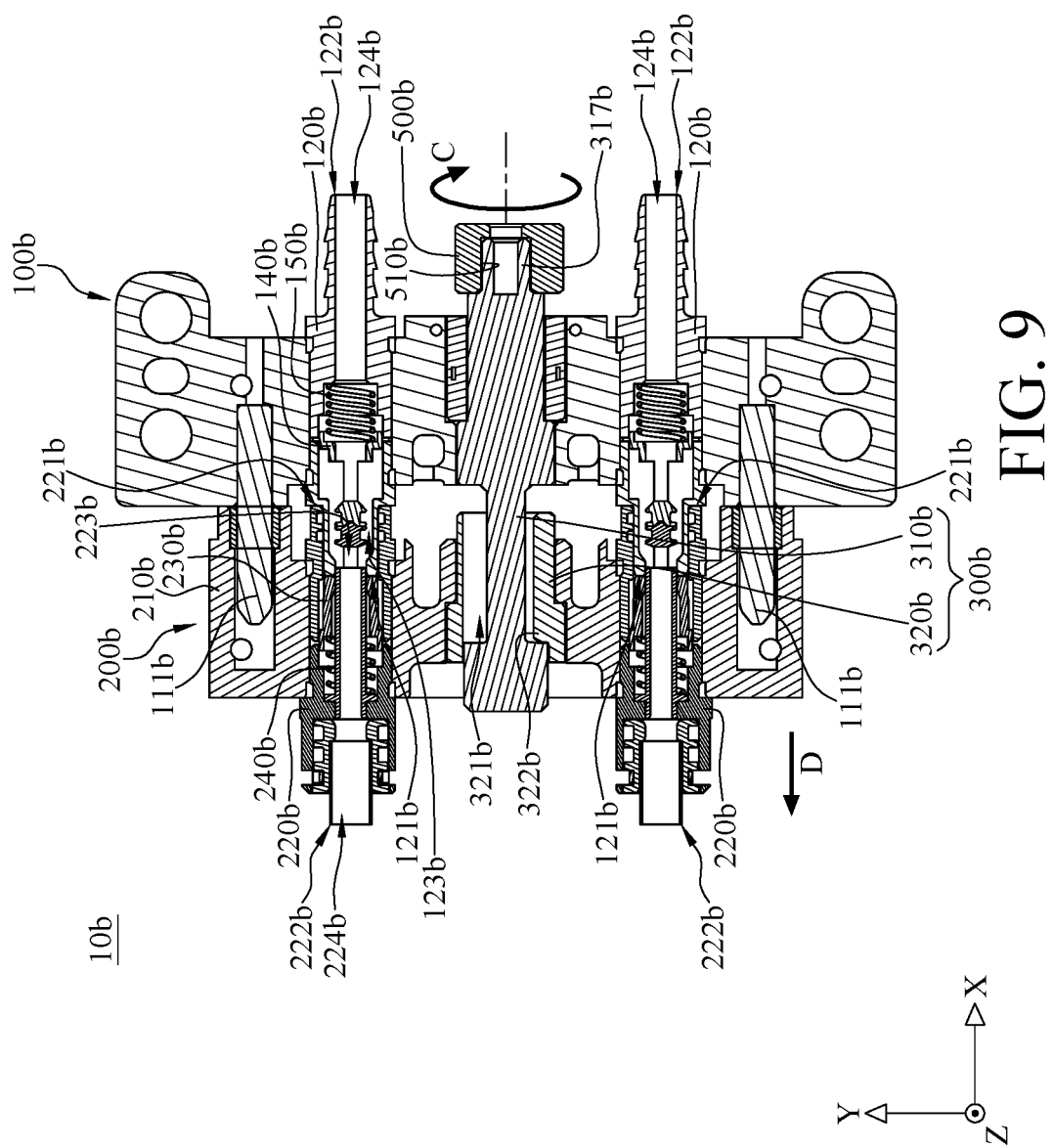
FIG. 9 is a cross-sectional view of the connector assembly according to the second embodiment of the disclosure while in an assembled state.

Please refer to FIG. 7 and FIG. 9. FIG. 9 is a cross-sectional view of the connector assembly according to the second embodiment of the disclosure while in an assembled state.

As shown in FIG. 9, when the handle 500b is rotated to rotate the rotatable component 310b in a direction C, the engaging portion 322b of the assembled component 320b is guided by the inclined surface 311b of the rotatable component 310b so that the first carrier 110b is moved toward the second carrier 210b in a direction D, and the two second coupling openings 223b of the two second connectors 220b are respectively connected to the two first coupling openings 123b of the two first connectors 120a with the guidance of the guiding pillars 111b and the guiding through holes 211b.

On the contrary, by rotating the handle 500b to rotate the rotatable component 310b in a direction opposite to the direction C, the engaging portion 322b is not restricted by the inclined surface 311b, allowing the first carrier 110b to be moved away from the second carrier 210b. By doing so, the two first connectors 120b are respectively able to be detached from the two second connectors 220b with the guidance of the guiding pillars 111b and the guiding through holes 211b.

Moreover, in this embodiment, the first connector module 100b further includes at least two first valves 140b and at least two first elastic components 150b. The two first valves 140b are respectively and movably located in the two first connectors 120b. The two first elastic components 150b are, for example, compression springs. Two opposite ends of each of the two first elastic components 150b respectively press against one of the first valves 140b and one of the first connectors 120b so that the two first valves 140b are respectively moved toward the first coupling openings 123b of the two first connectors 120b and thus seal the first coupling openings 123b.

The second connector module 200b further includes at least two second valves 230b and the at least two second elastic components 240b. The two second valves 230b are respectively and movably located in the two second connectors 220b. The two second elastic components 240b are, for example, compression springs. Two opposite ends of each of the two second elastic components 240a are respectively press against one of the second valves 230b and one of the second connectors 220b so that the two second valves 230b are respectively moved toward the second coupling openings 223b of the two second connectors 220b and thus seal the second coupling openings 223b.

As such, when the two second coupling openings 223b are respectively connected to the two first coupling openings 123b, the coupling ends 121b of the first connectors 120b respectively press the second valves 230b, and the coupling ends 221b of the second connectors 220b respectively press the first valves 140b such that the first connectors 120b are respectively connected to the second connectors 220b. Therefore, when the two second coupling opening 223b are respectively detached from the two first coupling openings 123b, the second valves 230b are not respectively pressed by the coupling ends 121b, and the first valves 140b are not respectively pressed by the coupling ends 221b such that the second valves 230b respectively seal the second coupling openings 223a by being pushed by the second elastic components 240b, and the first valves 140b respectively seal the first coupling openings 123b by being pushed by the first elastic components 150b.

The rotatable component 310b is driven by the handle 500b, but the present disclosure is not limited thereto. In some other embodiments, the rotatable component may be driven by a driver such as a motor.

Figure 10:
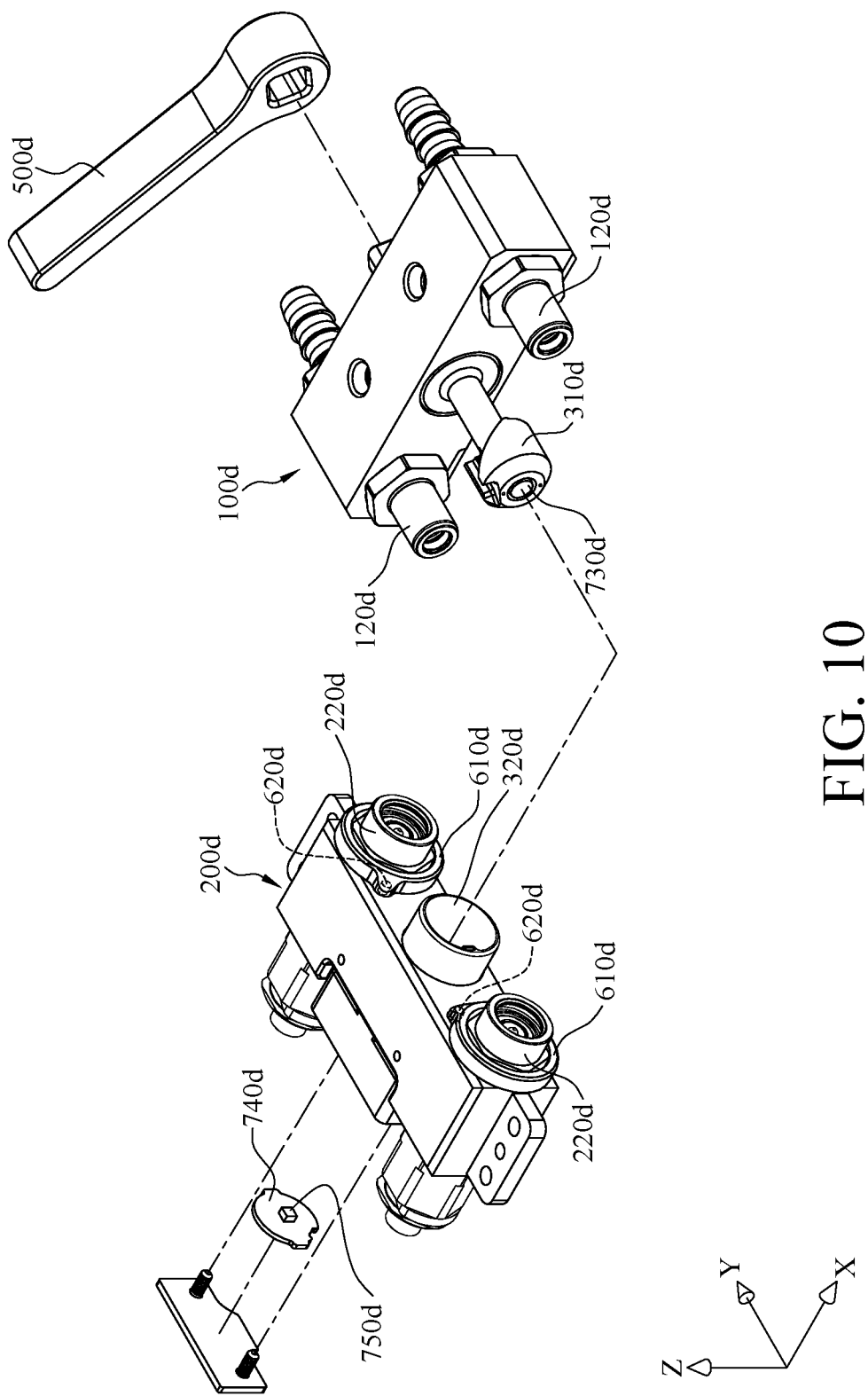
FIG. 10 is an exploded view of a connector assembly according to a third embodiment of the disclosure.

In the embodiment of FIG. 6, the first connector module 100b has the guiding pillars 111b, and the second connector module 200b has the guiding through holes 211b, but the present disclosure is not limited thereof. Please refer to FIG. 10 to FIG. 12. FIG. 10 is an exploded view of a connector assembly according to a third embodiment of the disclosure.

Figure 11:
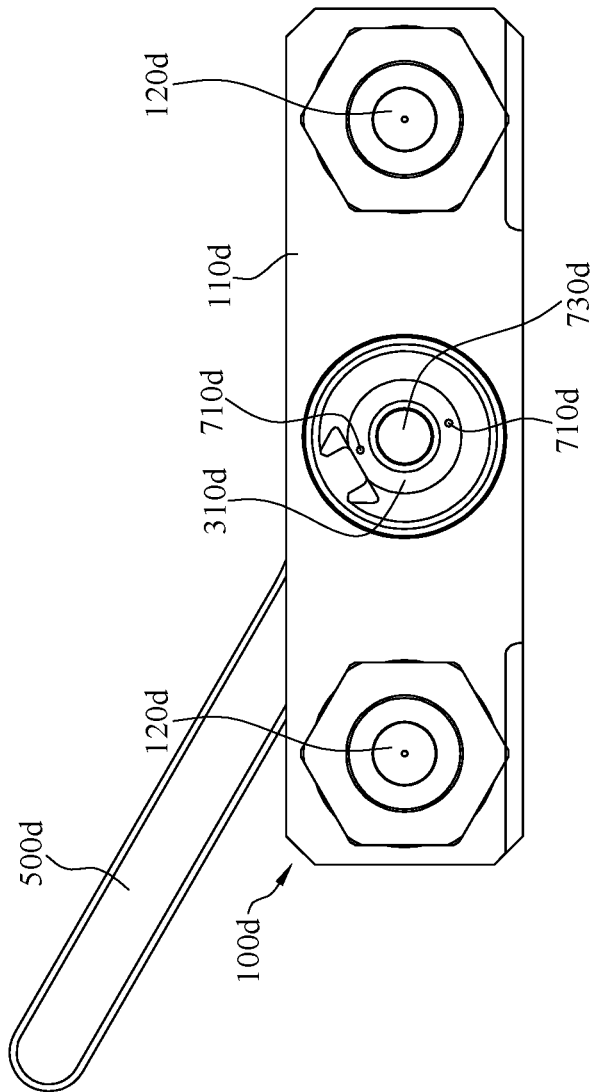
FIG. 11 is a schematic view of a first connector module of the connector assembly according to the third embodiment of the disclosure.
Figure 12:
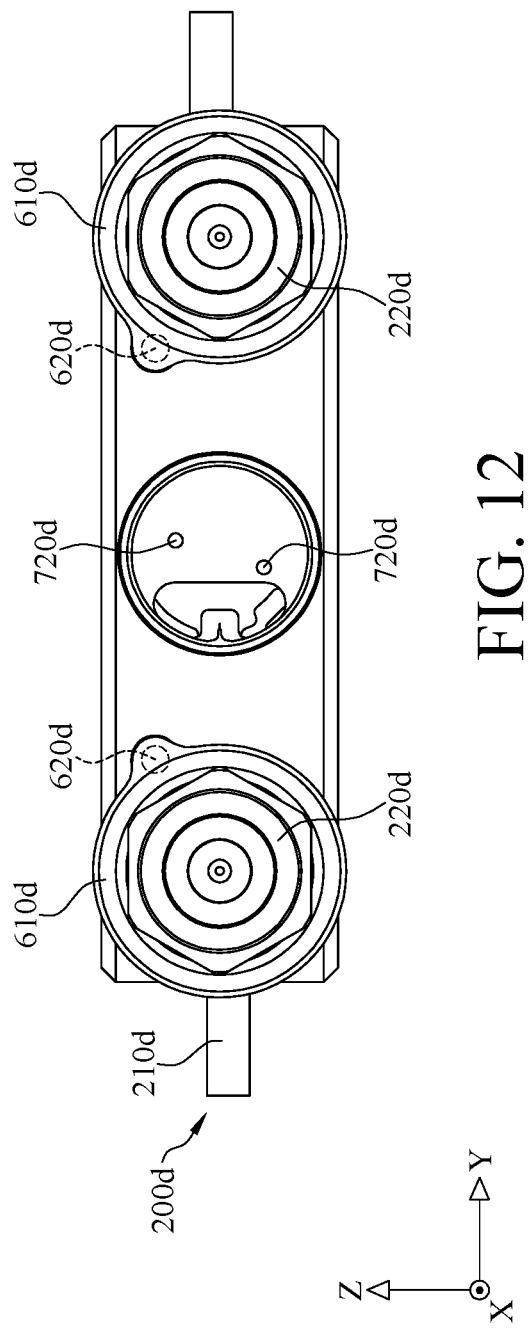
FIG. 12 is a schematic view of a second connector module of the connector assembly according to the third embodiment of the disclosure.

FIG. 11 is a schematic view of a first connector module of the connector assembly according to the third embodiment of the disclosure. FIG. 12 is a schematic view of a second connector module of the connector assembly according to the third embodiment of the disclosure.

In this embodiment, the connector assembly 10d is similar to the aforementioned connector assemblies, thus the following paragraphs will only describe the differences therebetween. In the connector assembly 10d, the first connector module 100d has no guiding pillar 111b shown in FIG. 6, and the second connector module 200d has no guiding through hole 211b shown in FIG. 6. That is, the first connector module 100d is driven to be close to or away from the second connector module 200d by the rotatable component 310d and the assembled component 320d.

In addition, the first connector module 100d further includes two first electrically conductive terminals 710d. The two first electrically conductive terminals 710d are disposed on the rotatable component 310d and exposed from an end surface of the rotatable component 310d away from the first carrier 110d. The second connector module 200d further includes two second electrically conductive terminals 720d. The two second electrically conductive terminals 720d are disposed on the assembled component 320d. The two second electrically conductive terminals 720d are respectively, detachably and electrically in contact with the two first electrically conductive terminals 710d.

The locations of the first electrically conductive terminals 710d and the second electrically conductive terminal 720d are not restricted. In some other embodiments, the first electrically conductive terminals and the second electrically conductive terminals may be separated from the rotatable component and the assembled component. For example, the first connector module may further include a first power connector which is mounted on the first carrier and located aside the rotatable component; and the second connector module may further include a second power connector which is mounted on the second carrier and located aside the assembled component, the engaging portion is guided by the inclined surface of the rotatable component so that the first carrier is moved toward to the second carrier so as to connect the first power connector to the second power connector, or the first carrier is moved away from the second carrier to detach the first power connector from the second power connector. Similar to the first connector and the second connector, the first power connector and the second power connector respectively are respectively disposed through the carriers.

In this embodiment, the first connector module 100d further includes a first sensing component 730d, and the first sensing component 730d is mounted on an end of the rotatable component 310d away from the first carrier 110d. The second connector module 200d further includes a circuit board 740d and a second sensing component 750d. The circuit board 740d is mounted on the assembled component 320d, and the second sensing component 750d is mounted on the circuit board 740d. The first sensing component 730d is configured to sense the second sensing component 750d so as to determine the state of the connection between the two first connectors 120d and the two second connectors 220d. For example, in this embodiment, the first sensing component 730d is a magnetic component, and the second sensing component 750d is a hall effect sensor. According to voltage measured by the hall effect sensor, a distance between the magnetic component and the hall effect sensor can be obtained, thus the state of the connection between the first connectors 120d and the second connectors 220d can be determined by the distance.

In addition, the second connector module 200d further includes two light sources 620d and two light guiding rings 610d. The two light guiding rings 610d are respectively surround the two second connectors 220a. The two light sources 620d are mounted on the second carrier 210d and respectively correspond to the two light guiding rings 610d. Light emitted by each light source 620d projects on the corresponding light guiding ring 610d and thus forms a halo. And this halo can help the user to find the second connector 220d, or can be taken as an indicating lamp that indicates the state of the connection between the first connector 120d and the second connector 220d.

Moreover, the aforementioned configurations in determining the connecting condition between the first connector and the second connector are not restricted. In some other embodiments, the first carrier may have a light guiding pattern, and the second connector module may further include a light source and a light guiding component. The light source and the light guiding component may be mounted on the second carrier, and the light source is configured to emit light on the light guiding component; when the first carrier and the second carrier are in contact with each other, the light emitted by the light source is projected on the light guiding pattern via the light guiding component; when the light guiding pattern lights up, it represents that the first connectors and the second connectors are well-connected.

Figure 13:
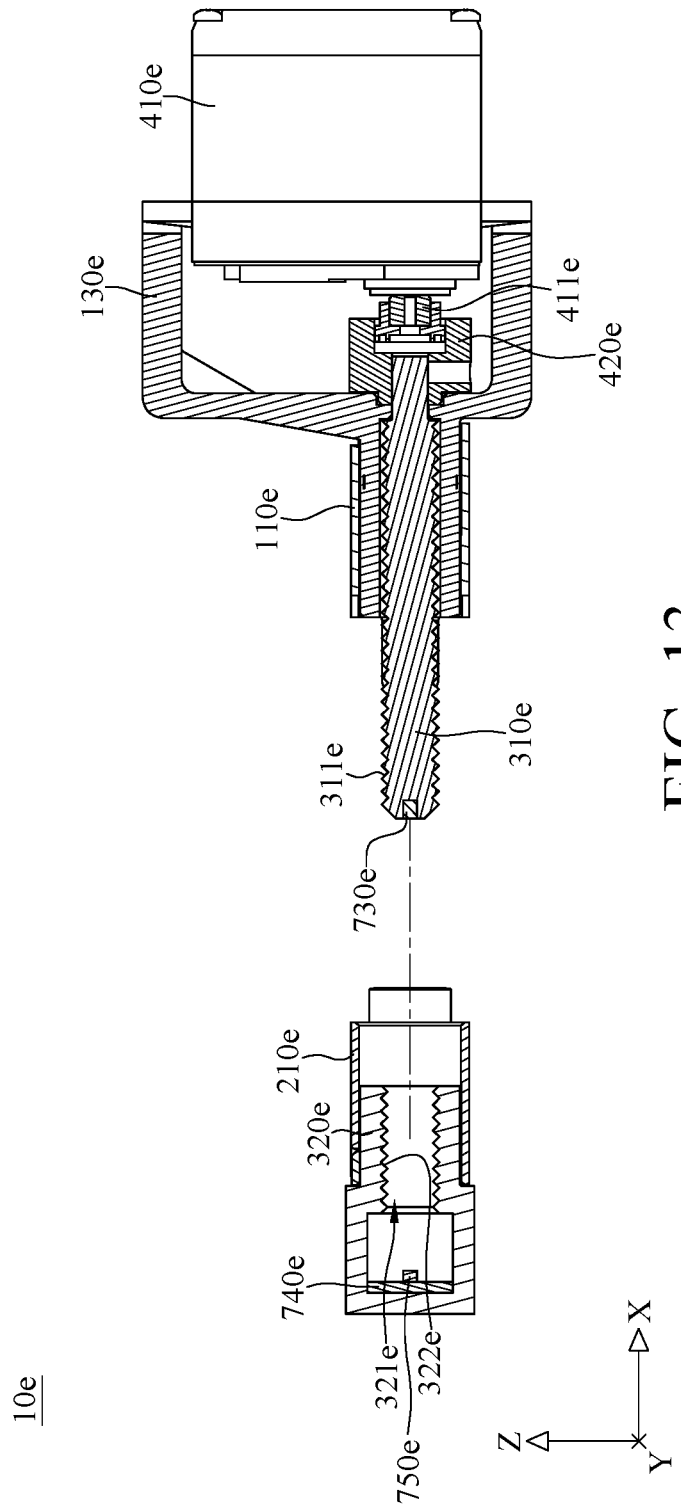
FIG. 13 is a cross-sectional view of a connector assembly according to a fourth embodiment of the disclosure.

However, the present disclosure is not limited to the embodiment in FIG. 10. Please refer to FIG. 13. FIG. 13 is a cross-sectional view of a connector assembly according to a fourth embodiment of the disclosure.

In this embodiment, the connector module is moved by an electric motor, and the connecting condition is determined by sensing components. In detail, a first connector module 100e further includes a first sensing component 730e, and the first sensing component 730e is mounted on an end of the rotatable component 310e away from the first carrier 110e, a second connector module 200e further includes a circuit board 740e and a second sensing component 750e. The circuit board 740e is mounted on the assembled component 320e, and the second sensing component 750e is mounted on the circuit board 740e. The first sensing component 730e is configured to sense the second sensing component 750e so as to determine the state of the connection between the two first connectors 120e and the two second connectors 220e. For example, in this embodiment, the first sensing component 730e is a magnetic component, and the second sensing component 750e is a hall effect sensor. According to voltage measured by the hall effect sensor, a distance between the magnetic component and the hall effect sensor can be obtained, thus the state of connection between the first connectors 120e and the second connectors 220e can be determined by the distance.

Figure 14:
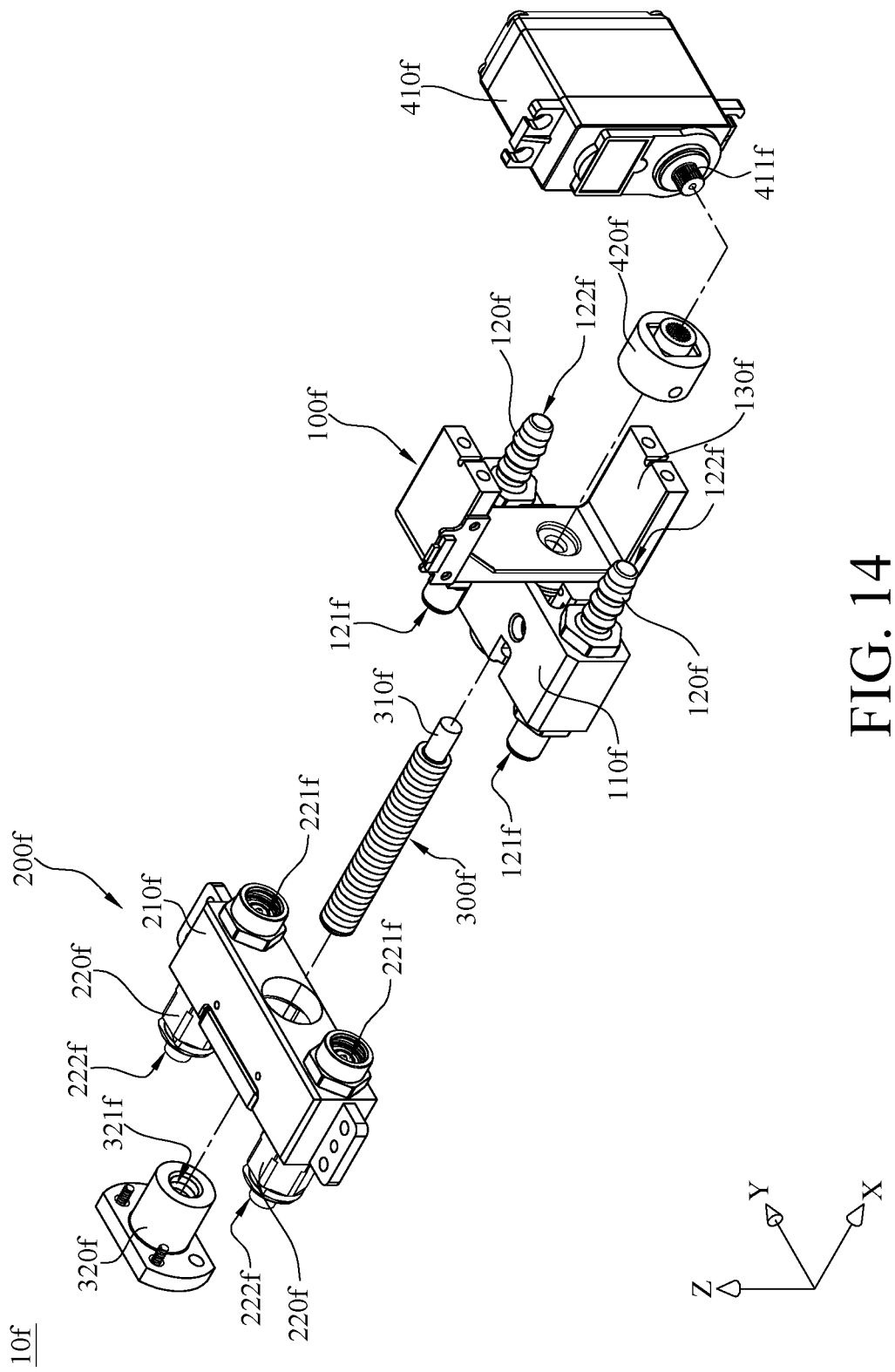
FIG. 14 is an exploded view of a connector assembly according to a fifth embodiment of the disclosure.

The aforementioned first connector module 100a has the guiding pillars 111a, and the second connector module 200a has the guiding through holes 211a, but the present disclosure is not limited thereto. Please refer to FIG. 14. FIG. 14 is an exploded view of a connector assembly according to a fifth embodiment of the disclosure.

This embodiment provides a connector assembly 10f. The connector assembly 10f includes a first connector module 100f, a second connector module 200f and a connection assistance module 300f.

The first connector module 100f includes a first carrier 110f, two first connectors 120f and a fixing frame 130f. The first carrier 110f is, for example, mounted on a casing of an external liquid cooling device (not shown). The two first connectors 120f are disposed through and fixed to the first carrier 110f. The two first connectors 120f are configured to deliver liquid, and each of the first connectors 120f has a coupling end 121f and a connecting end 122f. The fixing frame 130f is mounted on the first carrier 110f and located between the two connecting ends 122f of the two first connectors 120f.

The second connector module 200f includes a second carrier 210f and two second connectors 220f. The second carrier 210f is, for example, mounted on a portable electronic device such as a notebook computer or an all-in-one computer. The two second connectors 220f are disposed through and fixed to the second carrier 210f. The two second connectors 220f are respectively and detachably connected to the two first connectors 120f.

In detail, the two second connectors 220f are configured to deliver liquid, and each of the second connectors 220f has a coupling end 221f and a connecting end 222f. The two coupling end 221f are respectively and detachably connected to the two coupling end 121f. The two connecting ends 222f are configured to be connected to an internal liquid cooling device of a notebook computer.

In this embodiment, the first connectors 120f are disposed through the first carrier 110f, and the second connectors 220f are disposed through the second carrier 210f, but the present disclosure is not limited thereto. In some other embodiments, the first connectors and the second connectors may be respectively fixed to the first carrier and second carrier via the fixing frames.

It is noted that, the first connector module 100f has no guiding pillar 111a shown in FIG. 1, and the second connector module 200f has no guiding through hole 211a shown in FIG. 1. That is, the first connector module 100f is only driven to be close to or away from the second connector module 200f through a rotatable component 310f and an assembled component 320f.

The connection assistance module 300f includes the rotatable component 310f and the assembled component 320f. The rotatable component 310f is, for example, a screw rod. The rotatable component 310f is rotatably disposed on the first carrier 110f, and the rotatable component 310f has an inclined surface 311f. A normal line of the inclined surface 311f and a rotation axis of the rotatable component 310f form an acute angle. The assembled component 320f is in a ring shape and mounted on the second carrier 210f. The assembled component 320a has a screw hole 321f. The rotatable component 310f is screwed in the screw hole 321f of the assembled component 320f.

In this embodiment, the connector assembly 10f further includes a driver 410f and a shaft coupler 420f. The driver 410f is, for example, a motor. The driver 410f is mounted on the fixing frame 130f, and the driver 410f has an output shaft 411f. The shaft coupler 420f couples the output shaft 411f and the rotatable component 310f so that the driver 410f is able to rotate the rotatable component 310f.

According to the connector assembly as discussed above, with the help of the rotatable component of the connection assistance module, assembling the first connectors of the first connector module and the second connectors of the second connector module is time-saving and convenient.

In addition, it also can prevent the connectors from being broken due to hit between the connectors during the assembling process.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A connector assembly, comprising:
a first connector module comprising a first carrier and at least two first connectors, and the at least two first connectors being fixed to the first carrier;
a second connector module comprising a second carrier and at least two second connectors, the at least two second connectors being fixed to the second carrier, and the at least two second connectors respectively and detachably connected to the at least two first connectors; and
a connection assistance module comprising a rotatable component and an assembled component, the rotatable component rotatably disposed on the first carrier and having an inclined surface, a normal line of the inclined surface and a rotation axis of the rotatable component forming an acute angle, and the assembled component mounted on the second carrier and having an engaging portion;
wherein when the rotatable component is rotated, the engaging portion of assembled component is guided by the inclined surface so that the first carrier is moved toward or away from the second carrier, allowing the at least two first connectors to be detachably connected to the at least two second connectors;
wherein each of the at least two first connectors and the at least two second connectors has a coupling end and a connecting end opposite to each other, the coupling ends of the at least two first connectors are respectively coupled with the coupling ends of the at least two the second connectors, the connecting ends of the at least two the first connectors are configured to be connected to an external liquid cooling device, and the connecting ends of the at least two second connectors are configured to be connected to an internal liquid cooling device of a portable electronic device.

2. The connector assembly according to claim 1, wherein the assembled component is in a ring shape and has a through hole, the engaging portion is located in the through hole, and the rotatable component is mounted in the through hole of the assembled component.

3. The connector assembly according to claim 1, wherein the rotatable component and the at least two first connectors are disposed through the first carrier, the rotatable component is located between the at least two first connectors, the at least two second connectors are disposed through the second carrier, and the assembled component is located between the at least two second connectors.

4. The connector assembly according to claim 1, wherein the rotatable component further has a lateral surface, the lateral surface faces the inclined surface, the lateral surface and the inclined surface together form an acute angle, a groove is formed between the lateral surface and the inclined surface, and the engaging portion is movably located in the groove.

5. The connector assembly according to claim 4, wherein the rotatable component further has a first guiding surface and a second guiding surface, the first guiding surface is connected to the lateral surface, the second guiding surface is connected to the inclined surface, and a distance between the first guiding surface and the second guiding surface is gradually increased from a side of the first guiding surface near the inclined surface to a side of the first guiding surface away from the inclined surface.

6. The connector assembly according to claim 5, wherein the rotatable component further has a connecting surface, the second guiding surface and the inclined surface are respectively connected to two opposite sides of the connecting surface, the second guiding surface is further away from the first carrier than the inclined surface, a normal line of the connecting surface is perpendicular to the rotation axis, and the second guiding surface faces away from the inclined surface.

7. The connector assembly according to claim 1, wherein the rotatable component is a screw rod, and the inclined surface extends in a spiral manner.

8. The connector assembly according to claim 1, further comprising a driver and a shaft coupler, and the driver having an output shaft, wherein the shaft coupler is coupled to the output shaft and the rotatable component.

9. The connector assembly according to claim 8, wherein the driver is a motor.

10. The connector assembly according to claim 8, wherein the first connector module further comprises a fixing frame, the fixing frame is mounted on the first carrier, and the driver is mounted on the fixing frame.

11. The connector assembly according to claim 1, further comprising a handle, the handle having an assembling slot, the rotatable component having an assembling head which located on an end of the rotatable component away from the assembled component, wherein the assembling slot of the handle is mounted on the assembling head of the rotatable component, and the handle is configured to drive the rotatable component to rotate with respect to the first carrier.

12. The connector assembly according to claim 11, wherein the handle is detachably mounted on the rotatable component.

13. The connector assembly according to claim 1, wherein the first carrier has at least one guiding pillar, the second carrier has at least one guiding through hole, the at least one guiding pillar corresponds to the at least one guiding through hole so as to guide the first carrier to be moved with respect to the second carrier.

14. The connector assembly according to claim 1, wherein the first connector module further comprises two first electrically conductive terminals, the two first electrically conductive terminals are disposed on the rotatable component and exposed from an end surface of the rotatable component away from the first carrier, the second connector module further comprises two second electrically conductive terminals, the two second electrically conductive terminals are disposed on the assembled component, and the two second electrically conductive terminals are respectively, detachably and electrically in contact with the two first electrically conductive terminals.

15. The connector assembly according to claim 1, wherein the first connector module further comprises a first sensing component, the first sensing component is mounted on an end of the rotatable component away from the first carrier, the second connector module further includes a second sensing component, the second sensing component is mounted on the assembled component, the first sensing component is configured to sense the second sensing component so as to determine the state of connection between the at least two first connectors and the at least two second connectors.

16. The connector assembly according to claim 15, wherein the first sensing component and the second sensing component are respectively a hall effect sensor and a magnetic component.

17. The connector assembly according to claim 15, wherein the second connector module further comprises at least one light source, the at least one light source is mounted on the second carrier, and the activation of the at least one light source is determined by an interaction between the first sensing component and the second sensing component.

18. The connector assembly according to claim 17, further comprising at least one light guiding ring, wherein the at least one light guiding ring is mounted on the second carrier and surrounds one of the at least two second connectors, and the at least one light source corresponds to the at least one light guiding ring.

19. The connector assembly according to claim 18, wherein the quantities of the at least one light guiding ring and the at least one light source are two, the two light guiding rings respectively surround the at least two second connectors, and the two light sources respectively correspond to the two light guiding rings.

20. The connector assembly according to claim 1, wherein the first connector module further comprises a first power connector, the first power connector is mounted on the first carrier, the second connector module further comprises a second power connector, the second power connector is mounted on the second carrier; when the rotatable component is rotated, the engaging portion of the assembled component is guided by the inclined surface so that the first carrier is moved toward the second carrier so as to allow the first power connector to be connected to the second power connector, or the first carrier is moved away from the second carrier so as to allow the first power connector to be detached from the second power connector.

21. The connector assembly according to claim 1, wherein the first connector module further comprises at least two first valves and at least two first elastic components, the at least two first valves and the at least two first elastic components are respectively located in the at least two first connectors, and the at least two first valves are respectively pressed against by the at least two first elastic components so that the at least two first valves are respectively moved toward two first coupling openings of the at least two first connectors and seal the two first coupling openings.

22. The connector assembly according to claim 21, wherein the second connector module further comprises at least two second valves and at least two second elastic components, the at least two second valves and the at least two second elastic components are respectively located on the least two second connectors, and the at least two second valves are respectively pressed against by the at least two second elastic components so that the at least two second valves are respectively moved toward two second coupling openings of the at least two second connectors and seal the two second coupling openings.

23. A connector assembly, comprising:
a first connector module comprising a first carrier and at least two first connectors, and the at least two first connectors fixed to the first carrier;
a second connector module comprising a second carrier and at least two second connectors, the at least two second connectors fixed to the second carrier and respectively and detachably connected to the at least two first connectors;
a connection assistance module connected to the first carrier and the second carrier, and the connection assistance module configured to move the first carrier toward or away from the second carrier; and
a driver connected to the connection assistance module and configured to drive the connection assistance module to move the first carrier toward or away from the second carrier;
wherein each of the at least two first connectors and the at least two second connectors has a coupling end and a connecting end opposite to each other, the coupling ends of the at least two first connectors are respectively coupled with the coupling ends of the at least two the second connectors, the connecting ends of the at least two the first connectors are configured to be connected to an external liquid cooling device, and the connecting ends of the at least two second connectors are configured to be connected to an internal liquid cooling device of a portable electronic device.

24. The connector assembly according to claim 23, wherein the connection assistance module comprises a rotatable component and an assembled component, the rotatable component is mounted on the first carrier, the assembled component is mounted on the second carrier, and the rotatable component is configured to drive the assembled component to move toward or away from the first carrier in a straight line.

25. The connector assembly according to claim 24, wherein the assembled component is in a ring shape and has a through hole, and the rotatable component is mounted in the through hole of the assembled component.

26. The connector assembly according to claim 24, wherein the rotatable component and the at least two first connectors are disposed through the first carrier, the rotatable component is located between the at least two first connectors, the at least two second connectors are disposed through the second carrier, and the assembled component is located between the at least two second connectors.

27. The connector assembly according to claim 24, wherein the assembled component has an engaging portion, the rotatable component has an inclined surface and a lateral surface, a normal line of the inclined surface and a rotation axis of the rotatable component form an acute angle, the lateral surface faces the inclined surface, the lateral surface and the inclined surface together form an acute angle, a groove is formed between the lateral surface and the inclined surface, and the engaging portion is movably located in the groove through the guidance of the inclined surface.

28. The connector assembly according to claim 27, wherein the rotatable component further has a first guiding surface and a second guiding surface, the first guiding surface is connected to the lateral surface, the second guiding surface is connected to the inclined surface, and a distance between the first guiding surface and the second guiding surface is gradually increased from a side of the first guiding surface near the inclined surface to a side of the first guiding surface away from the inclined surface.

29. The connector assembly according to claim 28, wherein the rotatable component further has a connecting surface, the second guiding surface and the inclined surface are respectively connected to two opposite sides of the connecting surface, the second guiding surface is further away from the first carrier than the inclined surface, a normal line of the connecting surface is perpendicular to the rotation axis, and the second guiding surface faces away from the inclined surface.

30. The connector assembly according to claim 27, wherein the rotatable component is a screw rod, and the inclined surface extends in a spiral manner.

31. The connector assembly according to claim 23, wherein the driver is a motor.

32. The connector assembly according to claim 31, wherein the first connector module further comprises a fixing frame, the fixing frame is mounted on the first carrier, and the driver is mounted on the fixing frame.

33. The connector assembly according to claim 24, further comprising a handle, wherein the handle has an assembling slot, the rotatable component has an assembling head which is located on an end of the rotatable component away from the assembled component, the assembling slot of the handle is mounted on the assembling head of the rotatable component, and the handle is configured to drive the rotatable component to rotate with respect to the first carrier.

34. The connector assembly according to claim 33, wherein the handle is detachably mounted on the rotatable component.

35. The connector assembly according to claim 23, wherein the first carrier has at least one guiding pillar, the second carrier has at least one guiding through hole, and the at least one guiding pillar corresponds to the at least one guiding through hole so as to guide the first carrier to be moved with respect to the second carrier.

36. The connector assembly according to claim 24, wherein the first connector module further comprises two first electrically conductive terminals, the two first electrically conductive terminals are disposed on the rotatable component and exposed from an end surface of the rotatable component away from the first carrier, the second connector module further comprises two second electrically conductive terminals, the two second electrically conductive terminals are disposed on the assembled component, and the two second electrically conductive terminals are respectively, detachably and electrically in contact with the two first electrically conductive terminals.

37. The connector assembly according to claim 24, wherein the first connector module further comprises a first sensing component, the first sensing component is mounted on an end of the rotatable component away from the first carrier, the second connector module further includes a second sensing component, the second sensing component is mounted on the assembled component, the first sensing component is configured to sense the second sensing component so as to determine the state of connection between the at least two first connectors and the at least two second connectors.

38. The connector assembly according to claim 37, wherein the first sensing component and the second sensing component are respectively a hall effect sensor and a magnetic component cooperated to each other.

39. The connector assembly according to claim 38, wherein the second connector module further comprises at least one light source, the at least one light source is mounted on the second carrier, and the activation of the at least one light source is determined by an interaction between the first sensing component and the second sensing component.

40. The connector assembly according to claim 39, further comprising at least one light guiding ring, wherein the at least one light guiding ring is mounted on the second carrier and surrounds one of the at least two second connectors, and the at least one light source corresponds to the at least one light guiding ring.

41. The connector assembly according to claim 40, wherein the quantities of the at least one light guiding ring and the at least one light source are two, the two light guiding rings respectively surround the at least two second connectors, and the two light sources respectively correspond to the two light guiding rings.

42. The connector assembly according to claim 27, wherein the first connector module further comprises a first power connector, the first power connector is mounted on the first carrier, the second connector module further comprises a second power connector, the second power connector is mounted on the second carrier; when the rotatable component is rotated, the engaging portion of the assembled component is guided by the inclined surface so that the first carrier is moved toward the second carrier so as to allow the first power connector to be connected to the second power connector, or the first carrier is moved away from the second carrier so as to allow the first power connector to be detached from the second power connector.

43. The connector assembly according to claim 23, wherein the first connector module further comprises at least two first valves and at least two first elastic components, the at least two first valves and the at least two first elastic components are respectively located in the at least two first connectors, and the at least two first valves are respectively pressed by the at least two first elastic components so that the at least two first valves are respectively moved toward two first coupling openings of the at least two first connectors and seal the two first coupling openings.

44. The connector assembly according to claim 43, wherein the second connector module further comprises at least two second valves and at least two second elastic components, the at least two second valves and the at least two second elastic components are respectively located on the least two second connectors, and the at least two second valves are respectively pressed by the at least two second elastic components so that so that the at least two second valves are respectively moved toward two second coupling openings of the at least two second connectors and seal the two second coupling openings.

\* \* \* \* \*